(12) United States Patent
Suzuki et al.

(10) Patent No.: US 6,700,139 B2
(45) Date of Patent: Mar. 2, 2004

(54) GAP-BASE SEMICONDUCTOR LIGHT EMITTING DEVICE

(75) Inventors: Kingo Suzuki, Annaka (JP); Hitoshi Ikeda, Annaka (JP); Yasutsugu Kaneko, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/227,840

(22) Filed: Aug. 27, 2002

(65) Prior Publication Data
US 2003/0047745 A1 Mar. 13, 2003

(30) Foreign Application Priority Data
Aug. 31, 2001 (JP) ........................................ 2001-263843

(51) Int. Cl.[7] .............................................. H01L 33/00
(52) U.S. Cl. ........................... 257/103; 257/95; 257/99; 257/618
(58) Field of Search ............................ 257/95, 99, 103, 257/618

(56) References Cited

U.S. PATENT DOCUMENTS

| 5,798,536 A | * | 8/1998 | Tsutsui | ........................ | 257/99 |
| 2002/0163302 A1 | * | 11/2002 | Nitta et al. | ................... | 313/512 |

FOREIGN PATENT DOCUMENTS

| EP | 1061590 | * | 12/2000 | ........... | H01L/33/00 |
| JP | 2780744 | * | 5/1994 | ........... | H01L/33/00 |
| JP | 2907170 | * | 7/1998 | ........... | H01L/33/00 |

* cited by examiner

Primary Examiner—David Nelms
Assistant Examiner—Dao H. Nguyen
(74) Attorney, Agent, or Firm—Snider & Associates; Ronald R. Snider

(57) ABSTRACT

The main surface on the side of a p-type layer of a GaP-base semiconductor is defined as a first main surface, and the main surface opposite thereto as a second main surface. The second main surface is lapped and then etched using aqua regia to thereby collectively form thereon specular concave curved surfaces which swell inwardly into the semiconductor substrate in order to enhance total reflection of light. On the other hand, the area on the surface of semiconductor substrate excluding that for forming a first contact layer and excluding the second main surface are subjected to anisotropic etching to thereby collectively form outwardly-swelling convex curved surfaces in order to reduce total reflection of light. A second contact layer (second electrode) to be formed on the second main surface is composed of an alloy of Au, Si and Ni, and a first contact layer to be formed on the first main surface is composed of an alloy of Au as combined with either of Be and Zn. This successfully provides a GaP-base semiconductor light emitting device which can ensure a satisfactory level of improvement in the luminance even though the emission mechanism thereof relies upon indirect transition.

6 Claims, 8 Drawing Sheets

Example 3

Comparative Example 2

Prior Art

GAP-BASE SEMICONDUCTOR LIGHT EMITTING DEVICE

RELATED APPLICATION

This application claims the priority of Japanese Patent Application No. 2001-263843 filed on Aug. 31, 2001, which is incorporated herein by reference.

BACKGROUND OF THE INVENTION

1. Field of the Invention

The present invention relates to a GaP-base light emitting device.

2. Description of the Related Art

GaP-base semiconductor light emitting device can emit a wide range of color from red to green in the visible light wavelength region when it is composed of GaP semiconductor, or of mixed crystal semiconductor material which comprises GaP semiconductor as a base material and substitutive component such as GaAs, InP or AlP. Indirect transition property of GaP semiconductor allows the resultant GaP-base semiconductor light emitting device to have the same property, where the emission efficiency of which can be improved by doping nitrogen or the like which can produce a luminescent center.

The doping of nitrogen for improving the emission efficiency, however, undesirably varies emission wavelength, which is typified by a fact that a nitrogen-doped GaP semiconductor emits yellowish-green light in contrast to the non-doped one which emits green light. Moreover, excessive doping of nitrogen is disadvantageous in that an excessive portion of nitrogen not contributable to luminescent center suppresses the emission efficiency.

Thus a countermeasure should be made not only from a viewpoint of raising the internal emission efficiency (internal quantum efficiency) but also from that of raising external taking out efficiency (external quantum efficiency). Various shapes of the light emitting device have been proposed in pursuit of raising external taking out efficiency. An exemplary light emitting device shown in FIG. 8A has a p-n junction between an n-type layer 21 and a p-type layer 22, and an anode electrode 24 and cathode electrodes 25 so as to take the light out from the side of the p-type layer 22, in which a strategy for raising the external taking out efficiency is found in slope portions 23 formed on the lateral planes by mesa etching, which successfully reduces total reflection of the emitted light. There is also known another example of light emitting device in which the main surface and slope portions 23 in the foregoing device are roughened so as to reduce total reflection of the emitted light, and the main surface opposite to the taking-out side is also roughened so as to, on the contrary, enhance the total reflection of light (disclosed in Japanese Patent No. 2907170). FIG. 8B shows a resultant case derived from the device shown in FIG. 8A after such roughening.

The morphology of the light emitting device shown in FIG. 8B is, however, still unsuccessful in achieving a satisfactory level of light emission efficiency when applied to the foregoing GaP-base semiconductor light emitting device based on indirect transition, and a device without doping of nitrogen which serves as a luminescent center will only results in more poorer luminance.

SUMMARY OF THE INVENTION

The present invention was proposed considering the aforementioned drawbacks. It is therefore an object of the present invention to provide a GaP-base semiconductor light emitting device having an improved luminance.

A GaP-base semiconductor light emitting device of the present invention comprises a GaP-base semiconductor substrate internally having a p-n junction formed between a p-type layer and n-type layer, and electrodes for applying drive voltage for light emission to such semiconductor substrate, wherein a first main surface, which is defined as a main surface on the side of the p-type layer of the semiconductor substrate, and side surface thereof have a form of rough surface which comprises a collective of outwardly-swelling convex curved surfaces, and a second main surface, which is defined as a main surface on the side of the n-type layer, has a form of specular surface finished by etching using aqua regia.

Since the emitted light is taken out from the p-type layer side of the GaP-base semiconductor substrate, the main surface on the n-type layer side (second main surface) is finished as a specular surface in order to enhance total reflection of light. On the contrary, the first main surface and side surface are finished by roughening so as to produce a rough surface which comprises a collective of outwardly-swelling convex curved surfaces in order to reduce total reflection of light. Such constitution of the GaP-base semiconductor light emitting device of the present invention can beneficially raise the take out efficiency of the emitted light, which results in an improved luminance as compared with that of conventional devices.

Specular finishing of the second main surface is accomplished by etching thereof using aqua regia. The etching with aqua regia can produce, on the second main surface, a specular surface which comprises a collective of specular concave curved surfaces each of which swells inwardly into the semiconductor substrate. This successfully allows the second main surface to fully exhibit an effect of total reflection of light. Smoothening by lapping and successive etching with aqua regia of the second main surface can further facilitate conversion of such second main surface into a specular surface which comprises a collective of specular concave curved surfaces.

By composing the second main surface with a specular surface which comprises a collective of specular concave curved surfaces, ratio of total reflection of light on the second main surface can be improved as compared with that on the conventional smooth surface. Further, according to the present invention, the diameter of curvature of the concave curved surface is within a range from 5 μm to 150 μm, both ends inclusive, and an inward depth is within a range from 0.5 μm to 15 μm, both ends inclusive. The diameter of curvature less than 5 μm or the inward depth of less than 0.5 μm will only result in an insufficient level of concave curved surface, which prevents the total reflection on the second main surface from being fully improved. On the contrary, the diameter of curvature exceeding 150 μm will fail in ensuring a sufficient contact area with an electro-conductive paste. The inward depth of the concave curved surface exceeding 15 μm will interfere the specular nature, and will thus prevent the total reflection of light from being improved.

In consideration of the foregoing situations, the concave curved surface can successfully enhance the total reflection of light and can also function as a bonding surface with an electro-conductive paste when the diameter of curvature thereof is adjusted within a range from 5 μm to 150 μm, and an inward depth thereof within a range from 0.5 μm to 15 μm. The specular surface which comprises a collective of such specular concave curved surfaces can readily be formed on the second main surface by using aqua regia.

On the contrary, the first main surface from which the light is taken out and the side surface have collectively formed thereon outwardly-swelling convex curved surfaces in order to reduce total reflection of light. Such collective formation of the convex curved surfaces will successfully reduce total reflection of light on the first main surface and side surface, where the light includes that reflected on the second main surface which comprises a collective of the concave curved surfaces. This raises the taken-out efficiency and thus improves the luminance.

The GaP-base semiconductor substrate for composing the GaP-base semiconductor light emitting device can be produced by stacking properly oriented crystal according to epitaxial growth method. The collective formation of the foregoing convex curved surface can be achieved by anisotropic etching, which proceeds at different etching rates depending on plane orientation of the stacked crystal, whereby a plurality of convex curved surfaces having a uniform morphology can readily be formed.

Employment of the anisotropic etching is also beneficial since the diameter of the convex curved surface can be adjusted so that the rough surface composed of a collective of such convex curved surfaces can function as a micro-lens. Probability of causing total reflection of light can further be reduced by making the rough surface into the micro-lens.

The GaP-base semiconductor substrate of the GaP-base semiconductor light emitting device of the present invention is preferably bonded to an electrode support member so that the entire portion of the second main surface thereof is covered with an electro-conductive paste. Since the GaP-base semiconductor light emitting device is designed to take the light out from the p-type layer side, the main surface on the n-type layer side, that is, the second main surface is eventually bonded to the electrode support member placing the electro-conductive paste in between. As described in the above, the second main surface has collectively formed thereon the specular concave curved surfaces, where each of which swelling inwardly into the semiconductor substrate, so that it is successful in ensuring a large area for bonding with the elector-conductive paste to thereby enhance the bonding strength of the semiconductor substrate to the electrode support member. This consequently prevents the semiconductor substrate from being undesirably inclined with regard to the electrode support member or from dropping out therefrom even when external force is applied thereto in a lateral direction.

The first and second main surfaces of the GaP-base semiconductor substrate have arranged thereon the electrodes for applying voltage for light emission, where it is necessary to compose the contact layers, which are located on the side of such electrodes to be brought into contact with the semiconductor substrate, with a material excellent in ohmic contact property with the semiconductor substrate, which is typified by Au-base alloy. FIGS. 6A and 6B schematically show finished status of electrode formation on the first and second main surfaces, respectively. FIG. 6A shows the electrode (first electrode 60) formed on the first main surface 10 on the p-type layer side, where the electrode comprises the contact layer (first contact layer 62) and a bonding pad layer 61. A material composing the first contact layer 62 is preferably an alloy of Au (gold) and Be (beryllium), or an alloy of Au and Zn (zinc), both of which being advantageous in establishing ohmic contact with p-type materials. Thus the first contact layer 62 excellent in ohmic contact property can be formed. The bonding pad layer 61 is preferably composed of Au in consideration of contact property with the first contact layer. On the surface of thus-formed first electrode 60, an Au wire for current supply is bonded to thereby allow taking of light mainly out from an area excluding the formation area for the first electrode 60.

FIG. 6B shows a status of the electrode (second electrode 63) formed on the second main surface 11 on the n-type layer side. Since the second main surface 11 is bonded to the electrode support member placing the electro-conductive paste in between as described in the above, the second electrode 63 has no bonding pad layer, unlike the first electrode 60 having the bonding pad 61, and instead the electrode per se functions as the contact layer (second contact layer 64). It is necessary that a material composing the second contact layer 64 is not only advantageous in establishing ohmic contact with n-type materials but in exhibiting only a low absorption of emitted light. After extensive experiments and discussion, the present inventors obtained a finding that composing the second contact layer 64 with an alloy of Au (gold), Si (silicon) and Ni (nickel) results in an excellent ohmic contact with n-type materials, and can desirably suppress absorption of the emitted light by the second contact layer 64. Composition of the second contact layer 64 with an alloy of Au, Si and Ni is thus successful in further raising luminance of the taken light.

The luminance can thus be improved by composing the contact layers of the electrodes to be formed on the first and second main surfaces using the foregoing materials.

The paragraphs in the above dealt with the morphology of the GaP-base semiconductor substrate and materials for composing the contact layers of being comprised the electrodes capable of raising emission luminance of the GaP-base semiconductor light emitting device of the present invention. Applying these constituents of the present invention especially to the GaP-base semiconductor light emitting device can improve the luminance of such device, which could not have been achieved to a desirable level by the prior art.

The GaP-base semiconductor light emitting device of the present invention thus comprises a GaP semiconductor substrate internally having a p-n junction formed between a p-type layer and n-type layer, and electrodes for applying drive voltage for light emission to such GaP semiconductor substrate, wherein a first main surface, which is defined as a main surface on the p-type layer side of the GaP semiconductor substrate, and side surface thereof have a form of rough surface which comprises a collective of outwardly-swelling convex curved surfaces, a second main surface, which is defined as a main surface on the n-type layer side, is made into a specular surface which comprises a collective of specular concave curved surfaces, the electrodes formed on the first main surface have a contact layer comprising an alloy of Au as combined with either of Be and Zn, the electrodes formed on the second main surface has a contact layer comprising an alloy of Au, Si and Ni, and the semiconductor substrate is bonded to an electrode support member so that the entire portion of the second main surface thereof is covered with an electro-conductive paste. As described in the above, the second main surface can readily be made into the specular surface which comprises a collective of specular concave surfaces simply by lapping of such second main surface and successive etching thereof using aqua regia.

It should now be noted that the GaP semiconductor substrate in the context of this specification conceptually includes both of that having luminescent center formed by nitrogen doping, and that having no luminescent center.

DESCRIPTION OF THE PREFERRED EMBODIMENTS

One embodiment of the GaP-base semiconductor light emitting device according to the present invention, as well as production process thereof, will be explained referring to attached drawings.

Figure 1:
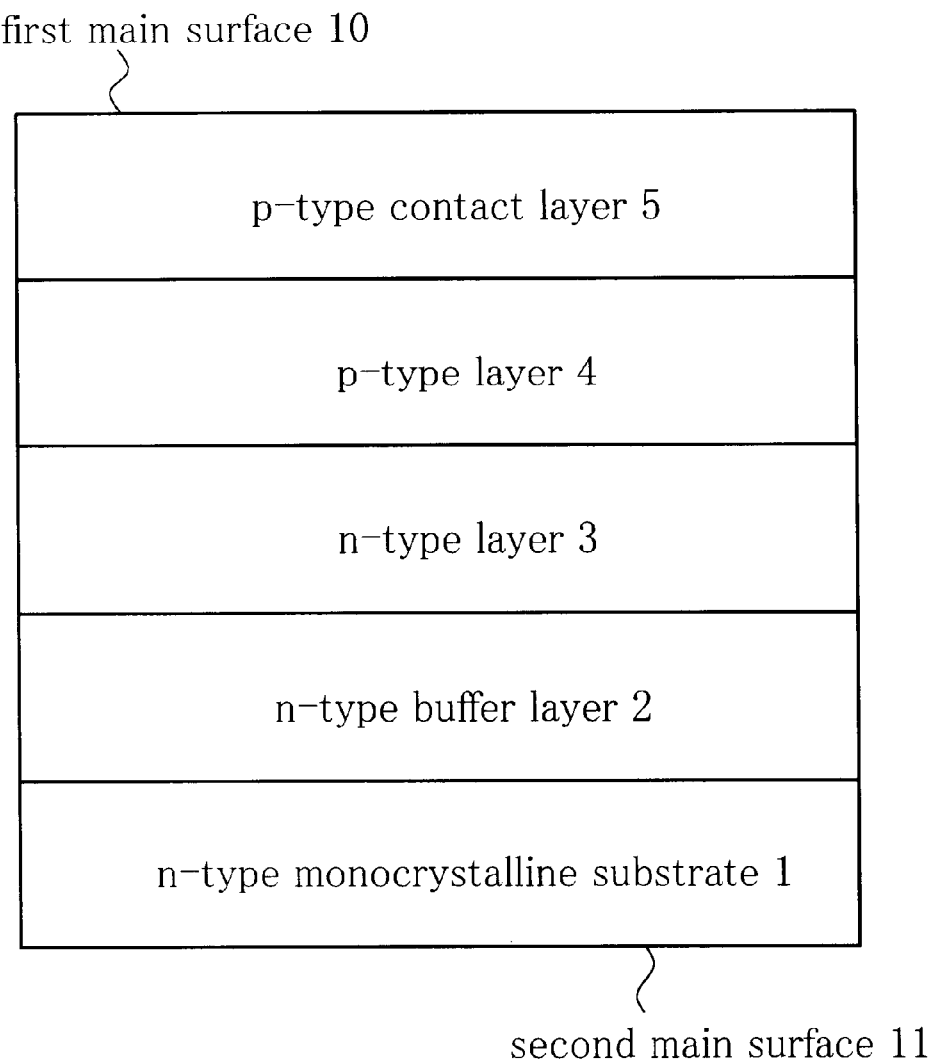
FIG. 1 is a schematic sectional view of a multi-layered stack according to one embodiment of the present invention.

First as shown in FIG. 1, an n-type single crystal substrate 1 made of a GaP-base semiconductor is successively stacked with an n-type buffer layer 2, an n-type layer 3, a p-type layer 4, and a p-type contact layer 5 in this order by liquid-phase epitaxial growth process.

It is also allowable that the n-type layer 3 and p-type layer 4 are doped with nitrogen which can create luminescent center.

Figure 2A:
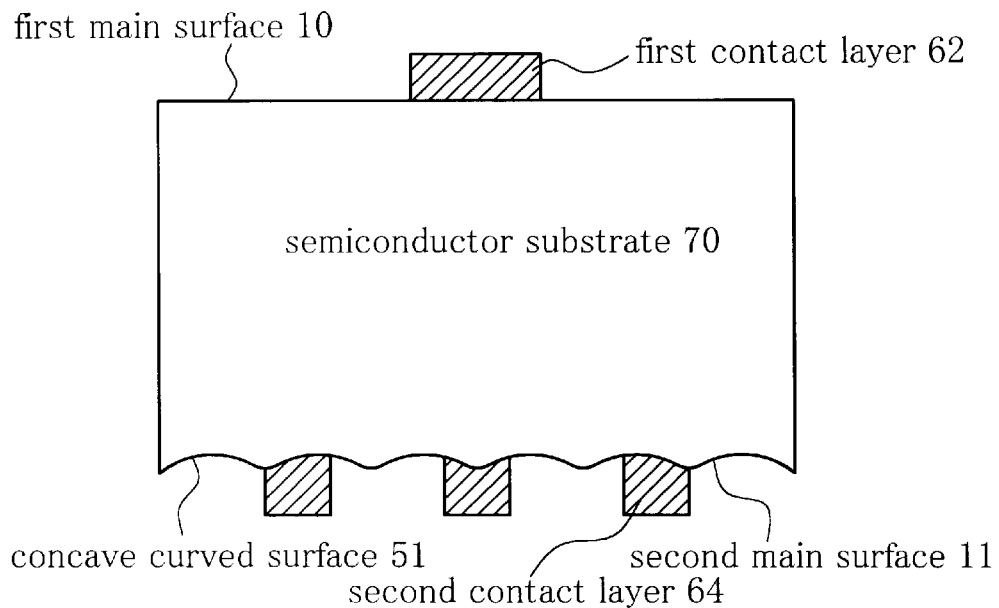
FIG. 2A is a schematic sectional view of a process step of the GaP-base semiconductor light emitting device according to one embodiment of the present invention.
Figure 2B:
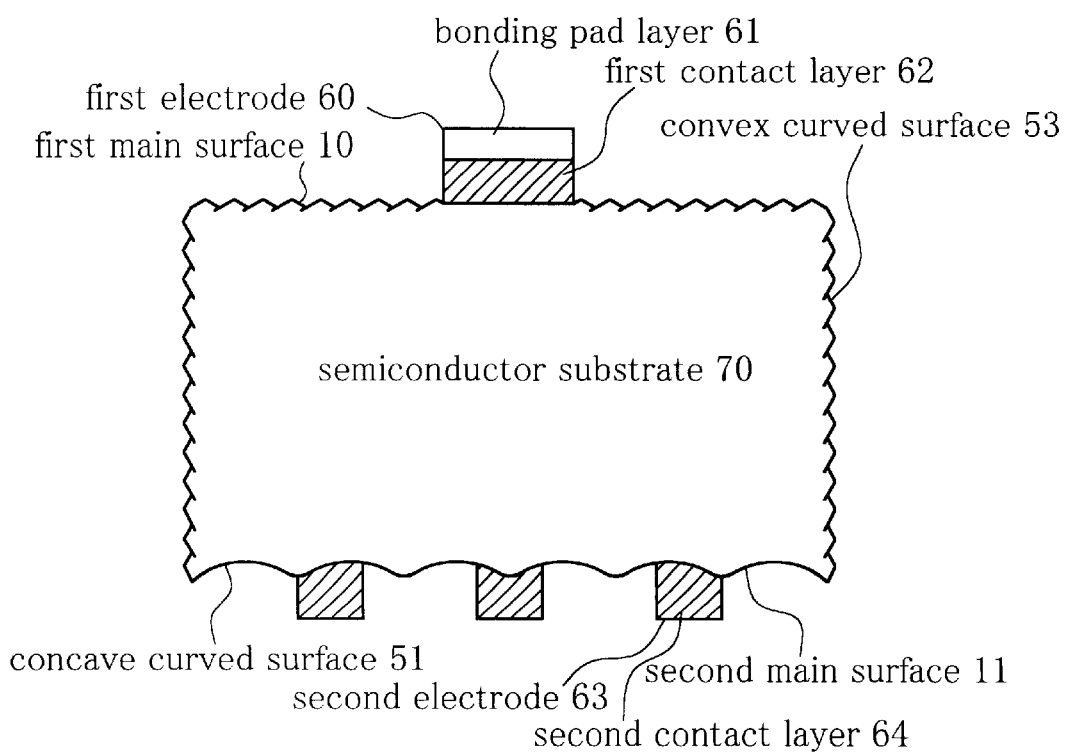
FIG. 2B is a schematic sectional view, as continued from FIG. 2A, of a process step of the GaP-base semiconductor light emitting device according to one embodiment of the present invention.
Figure 6A:
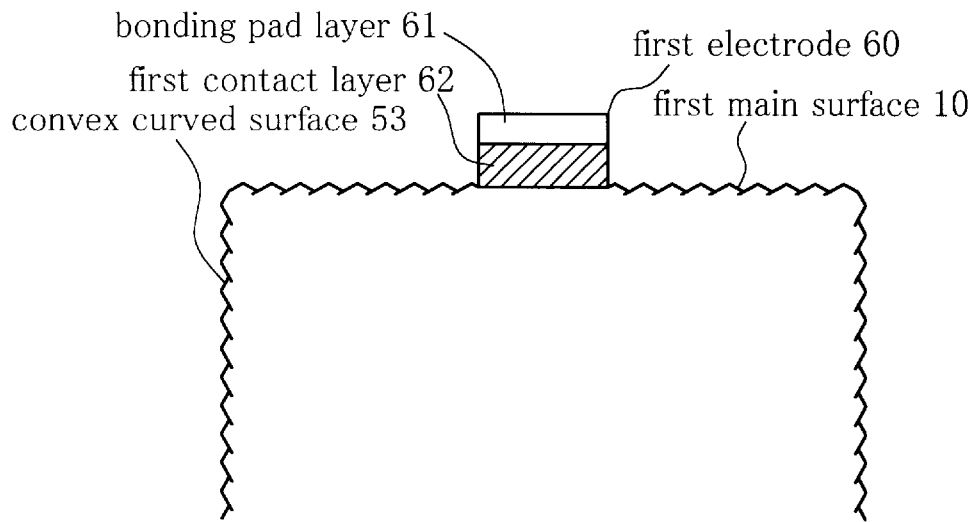
FIGS. 6A and 6B are schematic drawings for showing formation status of electrodes in the present invention.
Figure 6B:
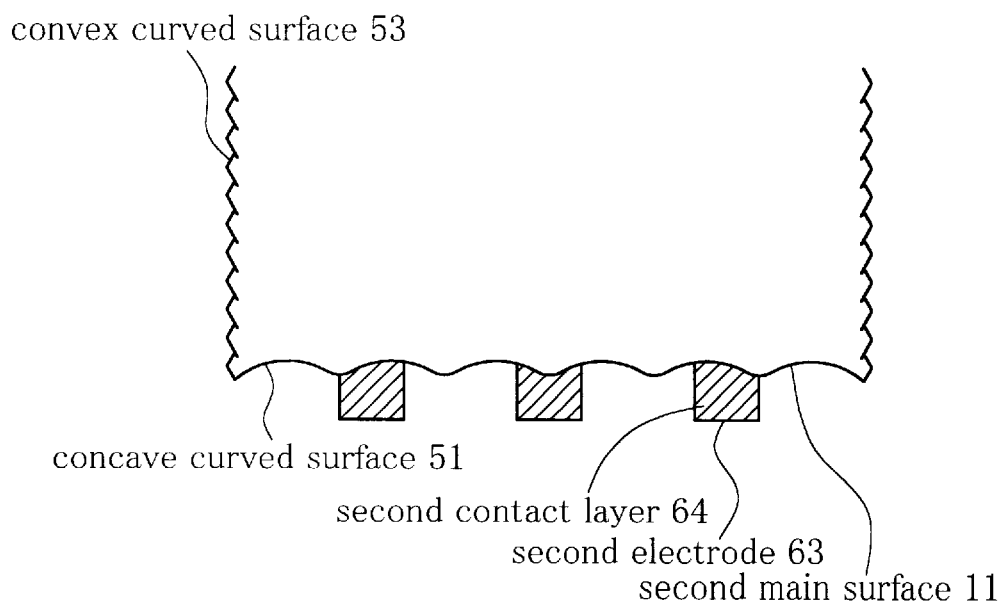

The second main surface 11 is smoothened by lapping, and then etched using aqua regia having a composition of hydrochloric acid and nitric acid of 1:1 by volume, or 3:1 by volume. The first contact layer 62 and second contact layer 64 are then formed by vacuum evaporation on the first main surface 10 and second main surface 11, respectively, as shown in FIGS. 6A and 6B, and divided by dicing into a plurality of semiconductor substrates 70 having collectively formed thereon the specular concave curved surfaces only on the second main surface as shown in FIG. 2A. The semiconductor substrate 70 is then etched in an anisotropic manner using hydrochloric acid to thereby collectively form the convex curved surfaces 53 in the area excluding that for forming the first contact layer 62 and second main surface 11, and on the first contact layer 62 the bonding pad layer 61 is further formed by vacuum evaporation to thereby obtain, as shown in FIG. 2B, one embodiment of the GaP-base semiconductor light emitting device of the present invention. The second contact layer 64 herein is composed of an alloy of Au, Si and Ni, the first contact layer 62 is composed of an alloy of Au as combined with either of Be and Zn, and the bonding pad layer 61 is composed of Au.

The morphology shown in FIG. 2B and the foregoing materials for the electrodes can improve the luminance as described in the above. This means that the rough surface which comprises a collective of the convex curved surfaces is responsible for reducing total reflection of the emitted light, and on the contrary, the specular surface (second main surface) which comprises a collective of the concave curved surfaces is responsible for enhancing total reflection of the emitted light. Forming the second contact layer with an Au-alloy layer comprising Au, Si and Ni can successfully reduce absorption of the emitted light by such layer as compared with a conventional Au-alloy layer comprising Au, Ge and Ni, or comprising Au, Sn and Te.

Figure 3A:
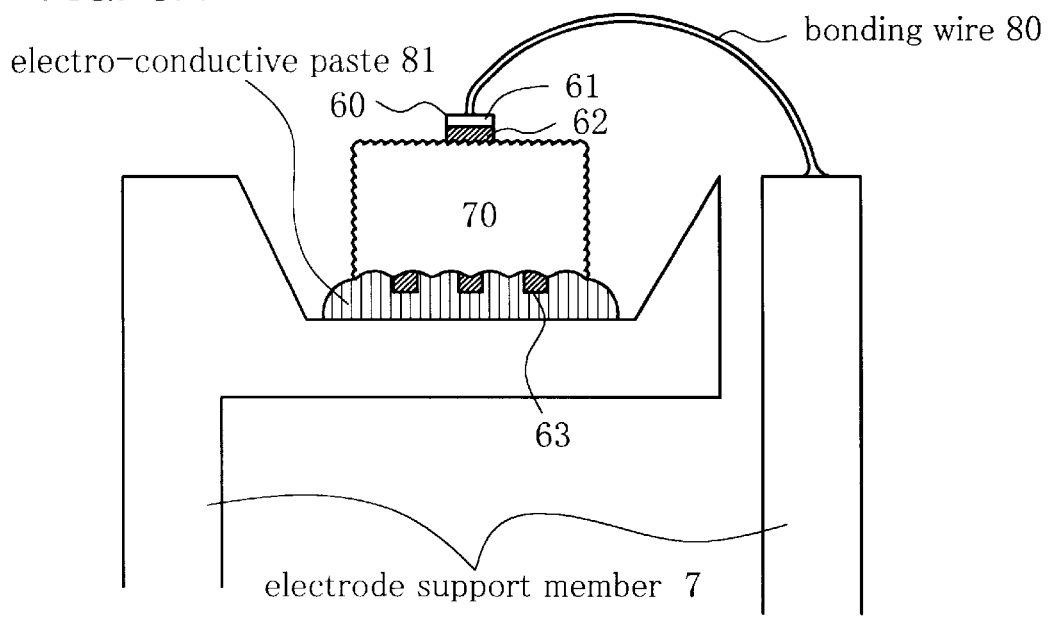
FIG. 3A is a schematic sectional view, as continued from FIG. 2B, of a process step of the GaP-base semiconductor light emitting device according to one embodiment of the present invention.
Figure 3B:
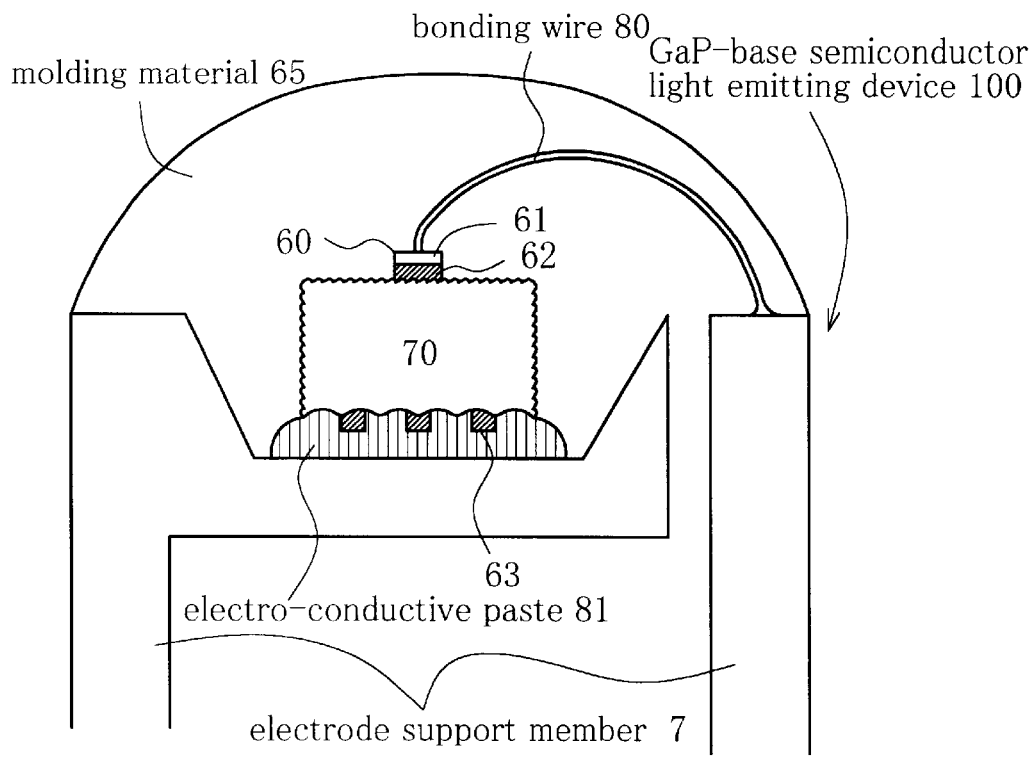
FIG. 3B is a schematic sectional view of the GaP-base semiconductor light emitting device according to one embodiment of the present invention.

Next, the semiconductor substrate shown in FIG. 2B is bonded to an electrode support member 7 using an electro-conductive paste 81 so that the entire portion of the second main surface 11 is covered with such paste, and an Au-made bonding wire 80 for current supply is bonded onto the surface of the first electrode 60 as shown in FIG. 3A. The entire product is then molded with a molding material 65 such as epoxy resin and the like, to thereby obtain a GaP-base semiconductor light emitting device 100 (FIG. 3B). The electro-conductive paste 81 can be composed of silver paste which has a large reflectivity for the emitted light.

Since the second main surface 11 is the specular surface which comprises a collective of the concave curved surfaces, the GaP-base semiconductor substrate 70 can be bonded on the electrode support member 7 with the electro-conductive paste 81 while being ensured with a sufficient contact area with such electro-conductive paste 81. This advantageously avoids inclination or lateral slipping of the semiconductor substrate 70, or peeling-off of the electro-conductive paste 81, which are otherwise likely to occur when an external force is laterally applied to the GAP-base semiconductor substrate 70.

EXAMPLES

Results of experiments aimed at confirming the effect of the present invention will be explained.

Example 1

A semiconductor substrate comprising GaP semiconductor was formed according to the process steps described in the above. Surfaces of thus obtained semiconductor substrate were observed under a scanning electron microscope (SEM) in order to evaluate the rough and specular profiles thereof. Results were shown in FIGS. 4A, 4B and 5.

Figure 4A:
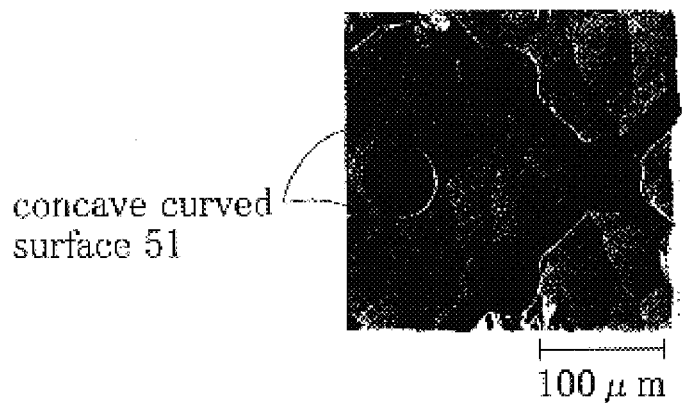
FIG. 4A is a SEM photograph obtained in relation to an example of the present invention, showing the second main surface as viewed from the vertical direction.
Figure 4B:
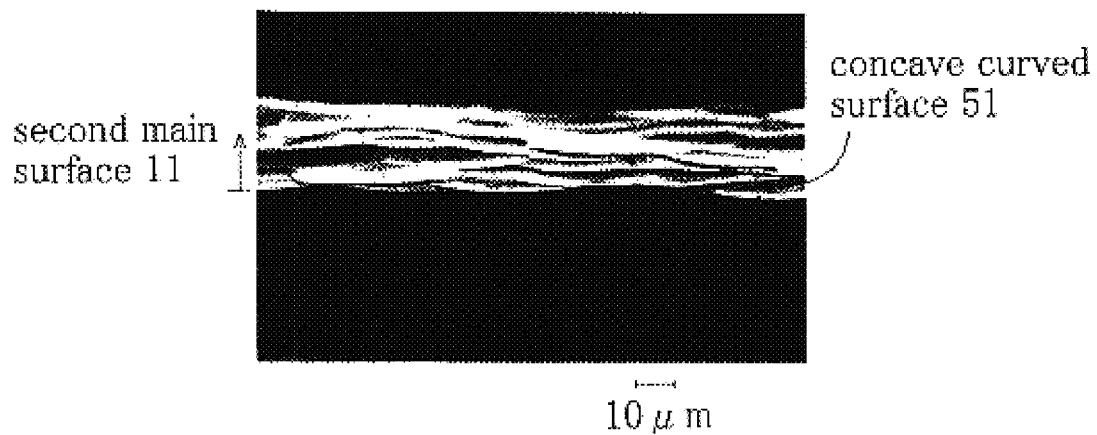
FIG. 4B is a SEM photograph obtained in relation to an example of the present invention, showing the second main surface as viewed from a near-parallel direction.

FIGS. 4A and 4B show observed results of the second main surface. FIG. 4A shows the second main surface observed from the direction normal thereto, and FIG. 4B shows that observed from a near-parallel direction. The observed results clearly indicate collective formation of the specular concave curved surfaces 51. It is to be noted that the field of view in FIG. 4A measures 270×270 $\mu m^2$, and the concave curved surface 51 is formed so that the diameter of curvature thereof falls within a range from 10 to 100 $\mu m$. On the other hand, the field of view in FIG. 4B measures 100×150 $\mu m^2$, and the concave curved surface 51 is formed so that the depth thereof falls within a range from 1 to 5 $\mu m$. Thus observed diameter of curvature and depth profile of the concave curved surface 51 indicate that the collective of such specular concave curved surfaces can readily be formed by etching of the second main surface using aqua regia. It is to be noted that a bright-and-dark pattern found in FIG. 4A is attributable to a vapor-deposited Au film for forming the electrode.

Figure 5:
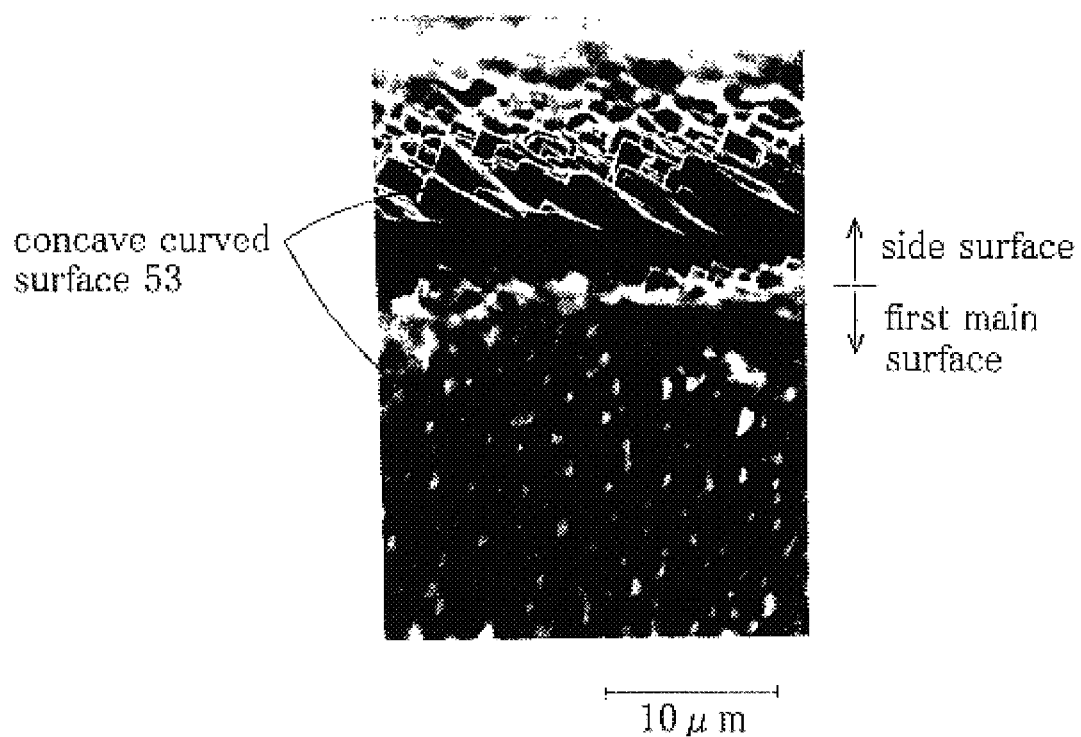
FIG. 5 is a SEM photograph obtained in relation to an example of the present invention, showing the first main surface and side surface as viewed from a direction near-parallel to the side surface.

FIG. 5 shows an observed result of the roughened first main surface, excluding the area for electrode formation, and side surface as viewed from a direction near-parallel to such side surface. FIG. 5 clearly indicate collective formation of the outwardly-swelling convex curved surfaces 53 on the first main surface and side surface by the anisotropic etching using hydrochloric acid. The field of view in FIG. 5 measures 25×37 $\mu m^2$. The diameter of curvature of the convex curved surface 53 is 5 $\mu m$ or below, which resides within a range not shorter than wavelength of the emitted light but smaller than that of the foregoing concave curved surface 51.

Example 2

The semiconductor substrate was formed under same conditions as described in Example 1, and was further fabricated into a GaP semiconductor light emitting device according to the procedures described in the above.

Comparative Example 1

The GaP semiconductor light emitting device was formed under same conditions as described in Example 2 except that the second main surface was not etched using aqua regia.

The GaP semiconductor light emitting devices obtained in Example 2 and Comparative Example 1 were subjected to measurement for the luminance. The results revealed that the luminance of the light emitting device obtained in Example 2 was higher by 20% than that of the device obtained in Comparative Example 1.

From the results, it was confirmed that the second main surface having a collective of the concave curved surfaces formed by etching with aqua regia shows higher luminance. As described in the above, by virtue of the morphology of the second main surface, as well as of roughening of almost the entire surface of the semiconductor substrate excluding the second main surface, and of forming of the contact layer on the second main surface using an alloy of Au, Si and Ni, which can reduce absorption of the emitted light, the present invention is successful in improving emission luminance and, as a consequence, the luminance of the semiconductor light emitting device even when the device is composed of GaP semiconductor having a nature of indirect transition.

Example 3

The semiconductor substrate was formed under same conditions as described in Example 1, and was then bonded to the electrode support member using a silver paste.

Comparative Example 2

The semiconductor substrate was formed under same conditions as described in Example 3 except that the second main surface was not etched using aqua regia, and was then bonded to the electrode support member using a silver paste.

Figure 7A:
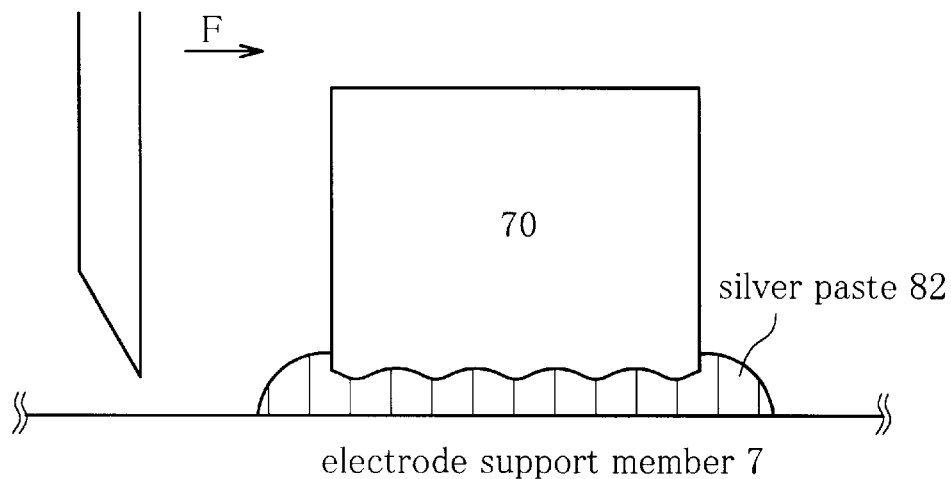
FIG. 7A is a schematic view for explaining measurement of bonding strength in relation to an example of the present invention.
Figure 7B:
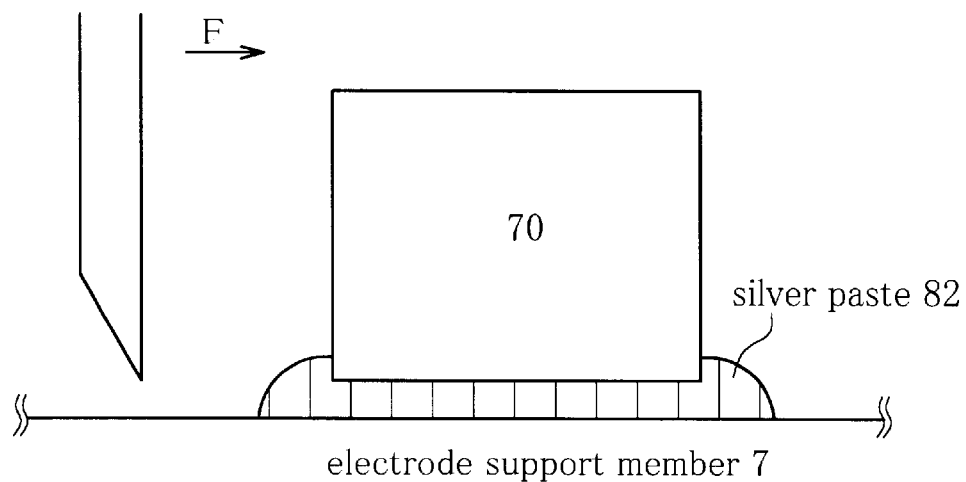
FIG. 7B is a schematic view for explaining measurement of bonding strength in relation to a comparative example.
Figure 8A:
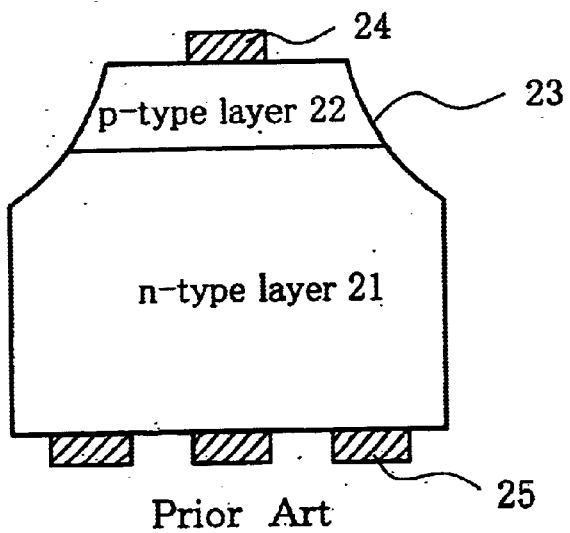
FIGS. 8A and 8B are schematic views for explaining conventional examples of surface profile of roughened semiconductor substrates.
Figure 8B:
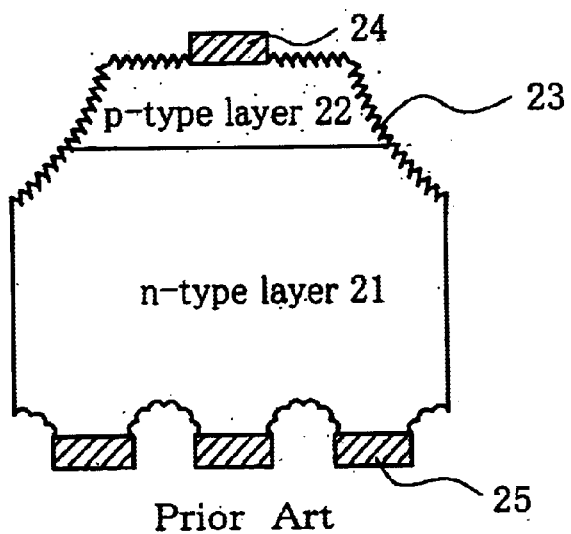

The products obtained in Example 3 and Comparative Example 2 were subjected to measurement for the bonding strength as shown in FIGS. 7A and 7B, in which force F was applied from the lateral direction and a level of such force causing the separation of the semiconductor substrate 70 from the silver paste 82 was assumed as the bonding strength. The measurement for bonding strength was repeated 30 times for each of the products obtained in Example 3 and Comparative Example 2. Results were shown in Table 1.

TABLE 1

|  | Comparative Example 2 | Example 3 |
| --- | --- | --- |
| Average | 111.4 gmf | 161.8 gmf |
| Maximum value | 199.0 gmf | 242.0 gmf |
| Minimum value | 69.0 gmf | 89.5 gmf |

It is clear from Table 1 that the semiconductor substrate of Example 3 showed larger values in all of the minimum value, maximum value and average of the bonding strength as compared with those for Comparative Example 2. It was thus confirmed that the collective formation of the specular concave curved surfaces on the second main surface by etching with aqua regia successfully ensured a large area for bonding with the silver paste to thereby enhance the bonding strength of the semiconductor substrate to the electrode support member.

The present invention is by no means limited to the Examples described in the above, and is applicable to any GaP-base semiconductor light emitting devices comprising GaP-base semiconductor substrate. While a multi-layered stack shown in FIG. 1 has an emission structure of single hetero-type, it is allowable to use double heterostructure which contains an active layer for improving the internal emission efficiency. It is still also allowable, from the viewpoint of improving external emission efficiency, to form the electrode on the first main surface with an transparent material such as ITO to thereby further widen the area from which the light can be taken out.

What is claimed is:

1. A GaP-base semiconductor light emitting device comprising a GaP-base semiconductor substrate internally having a p-n junction formed between a p-type layer and n-type layer, and electrodes for applying drive voltage for light emission to the semiconductor substrate, wherein a first main surface, which is defined as a main surface on the side of the p-type layer of the semiconductor substrate, and side surface thereof have a form of rough surface which comprises a collective of outwardly-swelling convex curved surfaces, a second main surface, which is defined as a main surface on the side of the n-type layer, has a form of specular surface comprising a collective of specular concave curved surfaces, each of which swells inwardly into the semiconductor substrate, and the concave curved surface has a diameter of curvature of 5 $\mu m$ to 150 $\mu m$, and an inward depth of 0.5 $\mu m$ to 15 $\mu m$.

2. The GaP-base semiconductor light emitting device according to claim 1, wherein the semiconductor substrate is bonded to an electrode support member so that the entire portion of the second main surface thereof is covered with an electro-conductive paste.

3. The GaP-base semiconductor light emitting device according to claim 1, wherein the electrodes formed on the second main surface has a contact layer comprising an alloy of Au, Si and Ni.

4. The GaP-base semiconductor light emitting device according to claim 1, wherein the electrode formed on the first main surface has a contact layer comprising an alloy of Au as combined with either of Be and Zn.

5. A Gap-base semiconductor light emitting device comprising a GaP semiconductor substrate internally having a p-n junction formed between a p-type layer and n-type layer, and electrodes for applying drive voltage for light emission to said GaP semiconductor substrate, wherein a first main surface, which is defined as a main surface on the side of the p-type layer of the GaP semiconductor substrate, and side surface thereof have a form of rough surface which comprises a collective of outwardly-swelling convex curved surfaces, a second main surface, which is defined as a main surface on the side of the n-type layer, is made into a specular surface which comprises a collective of specular concave curved surfaces comprising a collective of specular concave curved surfaces, each of which swells inwardly into the semiconductor substrate, the concave curved surface has a diameter of curvature of 5 $\mu$m to 150 $\mu$m, and an inward depth of 0.5 $\mu$m to 15 $\mu$m, the electrode formed on the first main surface has a contact layer comprising an alloy of Au as combined with either of Be and Zn, the electrodes formed on the second main surface have a contact layer comprising an alloy of Au, Si and Ni, and the semiconductor substrate is bonded to an electrode support member so that the entire portion of the second main surface thereof is covered with an electro-conductive paste.

6. A GaP-base semiconductor light emitting device according to claim 5, wherein the second main surface has a form of specular surface formed by lapping and successive etching using aqua regia.

* * * * *